United States Patent [19]

Zupancic

[11] Patent Number: 5,185,209
[45] Date of Patent: Feb. 9, 1993

[54] PHOTODEFINABLE INTERLEVEL DIELECTRICS

[75] Inventor: Joseph J. Zupancic, Bensenville, Ill.

[73] Assignee: Allied-Signal Inc., Morris Township, Morris County, N.J.

[21] Appl. No.: 676,675

[22] Filed: Mar. 28, 1991

[51] Int. Cl.$^5$ .............................................. B32B 27/42
[52] U.S. Cl. ................... 428/457; 156/655; 427/510; 428/460; 522/166; 526/247
[58] Field of Search ............... 428/457, 460; 156/655; 526/247; 427/43.1; 522/166

[56] References Cited

U.S. PATENT DOCUMENTS

| | | | |
|---|---|---|---|
| 4,816,498 | 3/1989 | Zupancic et al. | 528/151 |
| 4,855,375 | 8/1989 | Zupancic et al. | 526/247 |
| 4,908,096 | 3/1990 | Zupancic | 156/655 |

*Primary Examiner*—Paul J. Thibodeau
*Assistant Examiner*—D. S. Nakarani
*Attorney, Agent, or Firm*—Harold N. Wells; Mary Jo Boldingh; Gerhard H. Fuchs

[57] ABSTRACT

A predetermined pattern of a dielectric polymer is formed on a substrate from a prepolymer which is an ether of the oligomeric condensation product of a dihydric phenol and formaldehyde having the formula

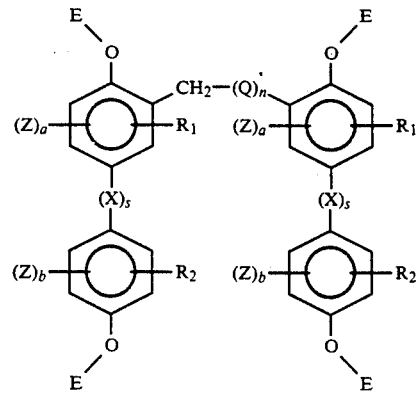

2 Claims, No Drawings

PHOTODEFINABLE INTERLEVEL DIELECTRICS

PRIOR ART

This invention relates to materials used to provide isolation of conductive layers in microelectronic circuitry. In particular, it relates to polymeric materials which can be photopolymerized so that dielectric layers can be formed where desired in multilayer structures. Such layers must be excellent insulators, have good chemical resistance and, of course, must adhere to the substrate on which they are placed.

Polyimides have been used for such dielectrics since they have superior temperature and chemical resistance compared to many other polymers. Literature and patents disclosing of the use of polyimides are extensively discussed by the present inventor in U.S. Pat. No. 4,908,096, which is incorporated herein by reference. The disadvantages of the polyimides are discussed, namely, that they release large amounts of volatiles during curing, absorb moisture, have poor adhesion, and have a relatively high coefficient of expansion. The patent discloses and claims the use of other polymers as interlevel dielectrics having improved properties, namely, vinyl benzyl or alkyl ethers of the condensation products of dialdehydes and phenols.

The present invention relates to other polymers which have been found to provide useful interlevel dielectrics.

In U.S. Pat. No. 4,855,375 the present inventor has disclosed oligomers which are ethers of bisphenols and formaldehyde which have application to making laminated boards for electronic applications. The patent is incorporated by reference herein. Such oligomers have been found to be useful as interlevel dielectrics, as will be seen in the discussion below. Related polymers are disclosed in co-pending U.S. patent applications Ser. Nos. 07/629,786 and 07/630,118.

SUMMARY OF THE INVENTION

This invention comprises a method of forming a predetermined pattern from a polymer on a substrate and the thus-created dielectric layers which may be used in an electronic interconnect structure.

Such patterns are created by coating onto the substrate a prepolymer and then irradiating the exposed portions of a masking pattern to render the prepolymer insoluble, then selectively dissolving the non-irradiated masked portions of the coating leaving the insoluble irradiated prepolymer, and curing the irradiated prepolymer to form an infusible glassy solid in the predetermined pattern.

The prepolymer is an ether of the oligomeric condensation product of a dihydric phenol and formaldehyde having the formula

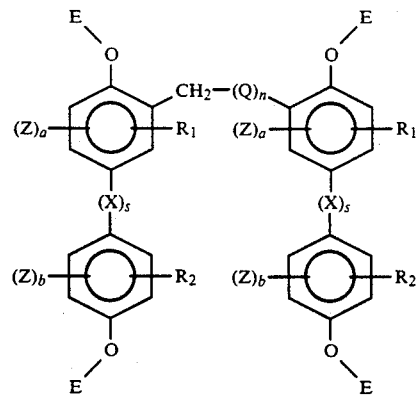

where the recurring unit Q has the structure,

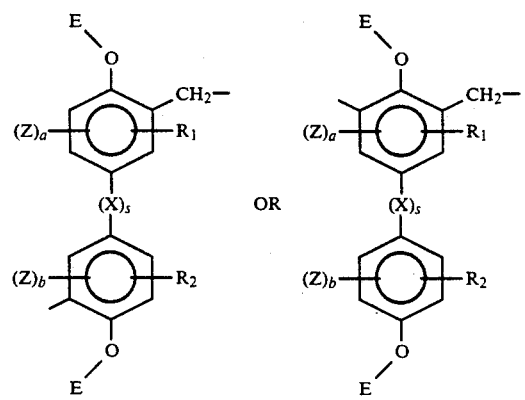

and n is an integer from 1 to 10;

s is 0 or 1;

each X is independently selected from the group consisting of $CH_2$, $C(CH_3)_2$, O, S, $SO_2$, CO, and $OC_6H_4O$ each $R_1$ and $R_2$ is independently selected from the group consisting of hydrogen, alkyl and alkoxy moieties containing 1 to 10 carbon atoms, phenyl and phenoxy;

a and b are independently 0 or integers from 1 to 4;

Z is Cl or Br;

E is selected from the group consisting of the vinylbenzyl moiety, alkyl moieties containing 1 to 10 carbon atoms, or benzyl, subject to the constraint that at least 50% of all E's are the vinylbenzyl moiety.

In a preferred embodiment, E is at least 70% vinyl benzyl and the remaining E's are propyl and X is $C(CH_3)_2$ or both $C(CH_3)_2$ and CO.

DESCRIPTION OF THE PREFERRED EMBODIMENTS

Polymeric Resins

In U.S. Pat. No. 4,855,375, the present inventor disclosed the preparation and use of the ethers of the oligomeric condensation products of a dihydric phenol and formaldehyde and their use in composites, especially laminated boards for electronic uses. It has now been found that these compositions can be used as interlevel dielectrics, where they have the advantages of low water absorption, low dielectric constant, low coefficient of thermal expansion, high glass transition temperature, high thermal stability, high solids coating concentrations, and are photochemically curable, thermally curable, and generate little or no volatiles during the curing process.

The prepolymers used in forming a pattern have the formula

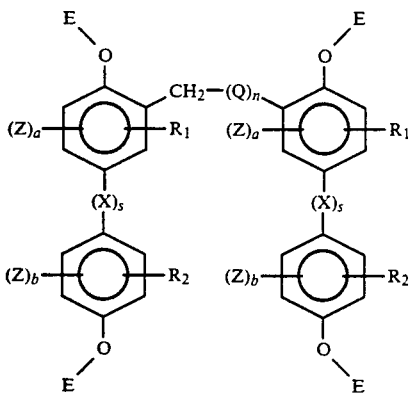

They result from the etherification of oligomers which are the condensation product of a dihydric phenol and formaldehyde. The product will be a mixture of oligomers with varying molecular weight. The number, n, of recurring units Q generally will vary from 1 to 10. Preferably, n is 1 or an integer from 1 to 6 and the number average of n is about 3.

The recurring unit Q itself has the structure,

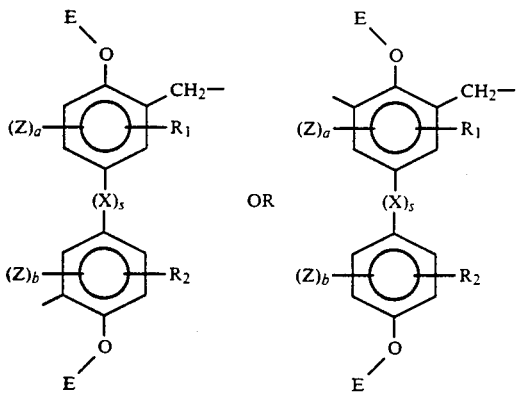

Note that the condensation may occur either on the same ring, as in the right hand structure, or in different rings, as in the left hand structure. The aromatic rings in the recurring unit Q are either joined directly or are separated by an intervening moiety X. That is, S is 0 or 1. Each of the moieties X is either a methylene [$CH_2$], isopropylidene [$C(CH_3)_2$], an oxygen, sulfur, sulfonyl [$SO_2$], carbonyl [CO] or a dioxyphenylene group [$OC_6H_4O$] where the oxygen of the latter generally are para or meta to each other. Preferably X is $C(CH_3)_2$ or both $C(CH_3)_2$ and CO.

Each of the aromatic rings may bear substituents or may be completely unsubstituted. Thus, $R_1$ and $R_2$ are independently selected from moieties such as hydrogen, alkyl moieties containing from 1 to 10 carbon atoms, the phenyl moiety, alkoxy moieties containing from 1 to 10 carbon atoms, and phenoxy, $C_6H_5O$. Examples of suitable alkyl moieties include methyl, ethyl, propyl, butyl, pentyl, hexyl, heptl, octyl, nonyl, and decyl moieties. The methyl and tert-butyl groups are preferred alkyl moieties, although the variant where $R_1=R_2=H$ is quite desirable.

The basic resins can be modified to be flame retardant by incorporating halogen atoms into the aromatic rings. Thus, Z may be a halogen atom, especially bromine, and where the aromatic ring is halogenated a and b are integers from 1 to 4. Polyhalogenated materials are preferred as flame retardants, and thus a and b are recommended to be 2, 3, or 4.

The oligomeric condensation products have a multiplicity of phenolic hydroxyl groups substantially all of which are end-capped as ether groups in our interlevel dielectric resins. The best case results where the ether portion, E, is a vinylbenzyl moiety, that is, of the structure.

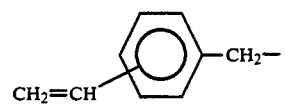

which may be either the meta- or para-isomer, and which usually is a mixture of the meta- and para-isomers. Although it is desirable to have all the phenolic hydroxyls end-capped with vinylbenzyl moieties, there is a cost advantage when fewer than all of the ether groups are vinylbenzyl, but usually at the expense of a somewhat lower dielectric constant. At least 50% of the E moieties should be a vinylbenzyl moiety, but better performance characteristics result when from 70 to 100% of the ether groups are vinylbenzyl, and the best prepolymer product results when 95 to 100% of such groups are vinylbenzyl. However, for many applications less than complete end-capping with vinyl benzyl groups is acceptable, but all of the hydroxyl groups should be capped.

Where the ether groups include other than vinylbenzyl, then E is an alkyl group containing from 1 to 10 carbons or a benzyl group. Where E is an alkyl group, the primary alkyl groups are preferred, especially the primary lower alkyl groups containing from 1 to 4 carbon atoms. Thus, the most desirable alkyl groups consist of methyl, ethyl, 1-propyl, 1-butyl, and 1-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth.

In a preferred embodiment, E is at least 70% vinyl benzyl and the remaining E's are propyl. The prepolymers may be prepared by acid catalyzed condensation of dihydric phenols with formaldehyde followed by end-capping substantially all the phenolic hydroxyls by converting them to ethers. Acid catalyzed condensation is preferred to avoid the formation of hydroxyl methylene groups, —$CH_2OH$. End-capping by ether formation can be effected by any suitable means, such as by reacting the phenolic condensation product with an alkyl or benzyl halide in a basic medium.

The resulting thermosetting oligomers may be polymerized with attendant crosslinking by a variety of curing means. When curing is effected by thermal means, it generally is autoinitiated by heating the oligomer resin in air at a temperature between about 100° and 300° C., and more particularly between about 120° and 300° C. Curing also may be brought about by chemical means using a free radical initiator such as azo-bisisobutyronitrile, benzoyl peroxide, di-t-butyl peroxide, etc. In the present invention curing is begun by irradiation, especially by ultraviolet light in the presence or absence of a sensitizer or photoinitiator, followed by thermal curing to produce an infusible, insoluble glassy solid.

Photodefinable Applications

The oligomers may be used as a passivant, as an interlevel dielectric, as a means of providing device deep dielectric isolation (insulator isolating trenches), as a high temperature solder mask, a photoresist, etc. Although much of what follows describes its use primarily as an interlevel dielectric, the skilled worker will recognize from this description how to use the materials of the invention in other applications as well.

The oligomers are applied as a coating to a suitable substrate. Preferably the coating will have a thickness of 2 to 15 μm, most preferably 5 to 10 μm. For the most part the substrates used will be a silicon wafer, a silicon chip of an integrated circuit, a printed circuit board or a ceramic substrate. The photosensitive oligomers may be applied by spin coating, spray coating, by use of a doctor knife, or any other conventional techniques known in the art to obtain a uniform coating. Where the viscosity is too high, a solution of the resin in a suitable solvent may be used. The oligomers are soluble in a broad class of solvents including polar aprotic solvents, aromatic hydrocarbons, halogenated hydrocarbons, ketones, ester, and so forth. Examples of solvents which may be employed in the practice of our invention include dimethylformamide (DMF), hexamethylphosphoramide (HMPA), N-methylacetamide (NMAc), N-N-dimethylacetamide (DMAc), dimethylsulfoxide (DMSO), N-methylpyrrolidone (NMP), benzene, toluene, xylene, ethyl benzene, cumene, dichloromethane, chloroform, carbon tetrachloride, chlorobenzene, tetrachloroethane, tetrachloroethylene, trichloroethane, gamma-butyrolactone, methyl ethyl ketone, diethyl ketone, hexanone, heptanone, octanone, methyl acetate, ethyl acetate, butyl acetate, 2-methoxyethylacetate, methoxy ethanol, ethoxy ethanol, diglyme, triglyme, and so forth. The solvent should be unreactive with both the substrate and the photosensitive oligomers and able to dissolve the resins to provide at least about a 10 weight-volume percent solution. Since the solvent is typically removed prior to further processing, it is also preferable that as low boiling a solvent as possible be used consistent with the foregoing considerations.

Although the oligomers may be photopolymerized directly, a photosensitizer or photoinitiator may be used and may be useful to decrease irradiation time. Where a photosensitizer or photoinitiator is used it will be added with the oligomers at the coating stage and will be present in an amount from about 0.001 to about 5.0 weight percent relative to the oligomerics. Examples of photosensitizers or photoinitiators which may be successively used in the practice of this invention include such materials as benzophenone, 4,4'-bis(dimethylamino)benzophenone, 4,4'-dimethoxybenzophenone, xanthone, acetophenone, 4-trifluoromethylacetophenone, triphenylene, thioxanthone, anthraquinone, 4-phenylbenzophenone, naphthalene, 2-acetonaphthalene, 1-acetonaphthalene, chrysene, anthracene, 9,10-dichloroanthracene, pyrene, triphenylene, 1-fluoronaphthalene, 1-chloronaphthalene, 1-bromonaphthalene, 1-iodonaphthalene, 1,3-dicyanobenzene, dimethyl isophthalate, diethyl isophthalate, methyl 3-cyano-benzoate, ethyl 3-cyano-benzoate, phenyl 3-cyano-benzoate, 2,2-dimethoxyacetophenone, 2,2-diethoxyacetophenone, 2,2'-dimethoxy-2-phenylacetophenone, 2,2'-diethoxy-2-phenylacetophenone, benzoin methyl ether, and 1-phenyl-1,2-propanedione-2-0-benzoyloxime. Preferred sensitizers include benzophenone, 4,4'-bis(dimethylamino)benzophenone, 1,3-dicyanobenzene, dimethyl isophthalate, diethyl isophthalate, methyl 3-cyano-benzoate, and phenyl 3-cyano-benzoate.

Where the photosensitive oligomers have been applied as a solution to the substrate the solvent used must be removed prior to irradiation. Consequently, it is conventional to heat the coated substrate for a time sufficient to remove essentially all of the solvent present, if any, prior to irradiation, a stage known as the "softbake." It is for this reason that the use of a low boiling solvent is preferred. It is acceptable to use enough heat to provide a semicured coating, especially since the oligomers may begin to cure at temperatures as low as about 110° C. The softbake can be carried out in vacuum, under an inert atmosphere (e.g., nitrogen, helium, argon, etc.) or in air.

A mask containing the desired pattern or image is placed on or adjacent to the coated substrate and the oligomeric coating is then irradiated through the mask by x-ray, electron beam, ion beam, ultraviolet, or visible radiation. For reasons of economy and ease of fabrication it is preferred to use radiation in the range from about 200 to about 800 nanometers. Since lower wave length radiation tends to afford better resolution, irradiation in the 200–500 nm range is preferred. With this treatment the irradiated portion of the coating becomes crosslinked so that the photocrosslinked oligomer is rather insoluble in the same solvent in which the original photosensitive oligomers remain quite soluble.

Irradiation may be done in either the presence or absence of oxygen. Exposure time necessary for adequate photocrosslinking to afford the differential solubility characteristic sought depends upon the wavelength of the light used, its intensity, the presence or absence of a photosensitizer or photoinitiator, and so forth, with a variation from a few seconds up through several minutes. For production purposes the shorter exposure times are highly preferred. One desirable characteristic of the photosensitive oligomers of this invention is that they photochemically crosslink throughout the thickness of the film. Therefore, the pattern shows no or minimal undercutting upon development.

The selective pattern appears upon development with the solvent. As mentioned above, upon irradiation the photosensitive oligomeric resin becomes extensively crosslinked with a subsequent large differential solubility between the crosslinked, or irradiated, and non-crosslinked, or non-irradiated, portions of the oligomers. The solvents used in the development are in general the same ones used in preparing a solution of the oligomers for coating purposes. Thus, classes of solvents include aprotic solvents, aromatic hydrocarbons, halogenated hydrocarbons, ketones, esters, the glymes, the Carbitols, and mixtures of solvents.

Upon development selective patterns appear where the elevated portions correspond to the photochemically crosslinked oligomers. These relief structures are then thermally cured to afford a highly crosslinked, infusible, glassy solid highly resistant to elevated temperatures, chemical degradation, ion transport, and which serves as an effective protective layer and dielectric insulator. Curing is attended by crosslinking of the vinyl groups and may be effected either thermally, chemically, or photochemically, with thermal curing preferred. Thermal curing is generally done in the temperature range between about 100° C. and about 300° C., and often is done in stages. So, for example, curing may first be effected at a temperature between about 150° C. and about 200° C. for 0.5-5 hours with postcuring at about 180° C.-300° C. for about 0.5-24 hours. Curing also may be brought about using a free radical initiator, such as azo-bis-isobutyronitrile, benzoyl peroxide, di-t-butylperoxide, and so on.

The oligomers of the invention have been found particularly useful in photodefinable applications since they may be coated as solutions with high solids levels and thus less solvent must be evaporated. Also, since no volatile by-products are generated during curing the shrinkage of the films is minimized.

MULTILAYER PROCESSING

The substrate (i.e., ceramic, alumina, silicon, printed wiring board, etc.) may be cleaned with conventional cleaning solvents (e.g., methylene chloride, chloroform, Genesolv ®, trichloroethylene, ethanol, methanol, sodium bisulfite, sodium sulfite, potassium sulfite, etc.) employing normal cleaning processes as known in the art. In addition, the substrate may contain circuitry already deposited upon it. The substrate may be utilized after the cleaning process or may be surface treated to promote adhesion between the substrate and the metals and/or polymer dielectric layer.

If used, an adhesion promoter between the substrate and the dielectric layer may be chosen from a range of surface silylating agents containing reactive groups capable of reacting with the polymers of the invention. Examples of surface silylating agents which can be employed are: vinylmethyldimethoxysilane, vinyltrimethoxysilane, vinylmethyldiethoxysilane, vinyltriethoxysilane, diethoxymethylvinylphenethylsilane, dimethoxymethylvinylphenethylsiblane, triethoxyvinylphenethylsiblane, trimethoxyvinylphenethylsilane, etc. Preferred silylating agents are vinylmethyldimethoxysilane, vinylmethyldiethoxysilane, diethoxymethylvinylphenethylsilane, and dimethoxymethylvinylphenethylsilane. The surface silylating agent would be applied to the substrate via dipping, spin coating, or other techniques from an alcohol-water solution. For example, a 1 to 10 wt. % solution of the silylating agent is dissolved in 85 to 98 wt. % of alcohol (e.g., methanol, ethanol, isopropanol, etc.) and 1 to 13 wt. % of water. The substrate is dipped in this solution for 15 seconds to 5 minutes, air dried for 1 minute to 5 hours, and then soft baked for 1 minute to 5 hours at 60° to 100° C. either in a convection oven, vacuum oven or hot plate.

The cleaned and/or surface treated substrate will be covered with a metal pattern before being covered with the dielectric layer of the invention. For example, a 500 to 1000Å layer of chromium, 8000 to 20000Å layer of copper and a 500 to 1000Å layer of chromium may be sputtered onto the surface. Then, the metal layer is coated with a commercial photoresist and processed according to the recommended processing scheme utilizing a spin coat, soft bake, imaging, developing, and hard bake cycle. This exposes portions of the metal layer to be removed by etching to create the pattern. The metals are etched utilizing standard wet techniques, for example: The top chromium layer is etched with a 1 to 30% hydrochloric acid solution activated with aluminum for 10 seconds to 5 minutes; the copper layer is etched with a sodium persulfate solution for 10 seconds to 10 minutes: the bottom chromium layer is etched with a 1 to 30 % hydrochloric acid solution activated with aluminum for 10 seconds to 5 minutes; and finally the etched substrate is washed with deionized water for 10 to 60 seconds. Then the remaining photoresist is stripped from the metal pattern as per the processing technique recommended for the photoresist. Finally the cleaned substrate is dried prior to the next processing step.

The dielectric layer is coated onto the substrate and its metal pattern and processed as follows: The prepolymer (e.g., 10 to 80 wt. %) solution in an appropriate solvent (toluene, NMP, DMF, etc.) is spin coated onto the substrate at a speed of 500 to 2500 rpm for 30 to 90 seconds; the prepolymer coated substrate is soft baked at a temperature of 25 to 60° C. for 15 minutes to 24 hours in a vacuum oven with or without a nitrogen bleed; the soft-baked coating is then imaged with a UV light source (220-320 nm range) for 15 seconds to 30 minutes employing a mask of desired design for vias and the like; the photocured polymer is then developed with an appropriate solvent system (e.g., toluene, toluene/hexane, toluene/ethanol, cyclohexane, ethyl acetate, butyl acetate, diglyme, etc.) at 25° to 35° C. with or without ultrasonics or via spraying for 5 to 120 seconds; the developed substrate can then be exposed to a stop or rinse bath or solvent spray based upon a solvent system miscible with the developing solvent but a poor solvent for the polymer system (for example hexane, pentane, ethanol, etc.) (optional step); the vias are then cleaned with a plasma or wet etch; and finally the dried substrate is hard baked in vacuum or under an inert atmosphere (nitrogen, argon, etc.) with a preferred cure cycle including a ramp from 25° to 300° C. for 30 minutes to 10 hours, a hold at 300° C. for 5 hours and then a cool down from 300° to 25° C. with a 10 minute to 3 hour ramp.

The process is repeated as required in order to form an electronic interconnect structure of desired electrical and dielectric levels.

EXAMPLE 1

Synthesis of Styrene Terminated Bisphenol-A-Formaldehyde (STBPA-F (100 VBz))

50.0 g of Bisphenol-A formaldehyde (BPA-F) (Mn=394, Mw=680, dispersity of 1.7) was dissolved in 220 mL of acetone in a 1000 mL 3-neck round bottom flask equipped with mechanical stirrer, thermometer, Therm-O-Watch, condenser, addition funnel and nitrogen purge. 66 mL (0.4644 moles) of vinylbenzylchloride (60/40 para/meta isomer ratio) was added to the reaction mixture and stirred for 30 minutes. The reaction mixture was heated to 65° C. and then 41.80 g (0.745 moles) of potassium hydroxide in 143 mL of methanol was added to the reaction mixture over a 1 Hr period. The reaction was refluxed for 1 Hr. with stirring, the reaction mixture was cooled to ambient temperature and allowed to stir for an additional 18 Hrs. The reaction mixture was recovered, dried over magnesium sulfate, filtered and concentrated under vacuum yielding a red resinous product of Mn=501, Mw=778, dispersity of 1.6

EXAMPLE 2

Synthesis of Styrene Terminated Bisphenol-A-Formaldehyde (STBPA-F (70 VBz/30 Pr))

Bisphenol-A formaldehyde (BPA-F) was prepared as follows: 456.58 g (2.00 moles) of bisphenol-A, 90.00 g (3.00 mole of formaldehyde functionality) of paraformaldehyde, and 500 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 2.00 mL of concentrated sulfuric acid was added dropwise over a 30 minute interval. The reaction was maintained at 80° C. for 1 day. The solvent was distilled from the reaction mixture with the reactor equipped with a Dean-Stark trap and then the resin was poured into an aluminum pan, yielding 508.7 g of resin, $M_n=740$, $M_w=8800$, dispersity of 12.0.

228.31 grams of the above BPA-F was dissolved in 700 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 213.67 g (1.400 moles) of vinylbenzylchloride (60/40 para/meta isomer ratio) and 0.10 g of 2,6-di-tert-butyl-p-cresol (BHT). The reaction mixture was heated to 60° C. and 98.2 g (1.750 moles) of potassium hydroxide in 325 mL of methanol was added dropwise over a 1.5 hr interval. The reaction was maintained at 60° C. for 19 hrs with stirring under a nitrogen purge. 99.63 g (0.810 moles) of n-propylbromide was added to the reaction mixture, to this reaction mixture was then added 45.45 g (0.810 moles) of potassium hydroxide in 150 mL of methanol over a 2 hr. interval, the reaction was maintained at 60° C. for 18 hrs. After cooling to room temperature the reaction mixture was transferred to a separatory funnel, 2 Liters of toluene was added and then washed four times with 2 Liters of water, dried over magnesium sulfate, filtered and stripped under vacuum, yielding 636.6 g of resin; $M_n=1100$, $M_w=18000$, dispersity of 17.0; IR indicates presence of no residual hydroxyl moieties.

EXAMPLE 3

Synthesis of Styrene Terminated Bisphenol-A-Formaldehyde (STBPA-F (70 VBz/30 Pr))

Bisphenol-A formaldehyde (BPA-F) was prepared as follows 456.6 g (2.00 moles) of bisphenol-A, 45.04 g (1.50 mole of formaldehyde functionality) of paraformaldehyde, and 350 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 4.00 mL of concentrated sulfuric acid was added dropwise over a 5 minute interval. The reaction was maintained at 80° C. for 1 day. The solvent was distilled from the reaction mixture with the reactor equipped with a Dean-Stark trap and then the resin was poured into an aluminum pan, yielding 447.6 g of resin, $M_n=230$, $M_w=1400$, dispersity of 5.8.

228.29 grams of the above BPA-F was dissolved in 700 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 213.67 g (1.400 moles) of vinylbenzylchloride (60/40 para/meta isomer ratio) and 0.10 g of 2,6-di-tert-butyl-p-cresol (BHT). The reaction mixture was heated to 60° C. and 98.19 g (1.750 moles) of potassium hydroxide in 430 mL of methanol was added dropwise over a 2.0 hr interval. The reaction was maintained at 60° C. for 19 hrs with stirring under a nitrogen purge. 99.63 g (0.810 moles) of n-propylbromide was added to the reaction mixture, to this reaction mixture was then added 45.45 g (0.810 moles) of potassium hydroxide in 230 mL of methanol over a 1.25 hr. interval, the reaction was maintained at 60° C. for 18 hrs. Analysis of a small aliquot of the reaction mixture after work-up indicates residual hydroxyl groups. 9.96 g (0.081 moles) of n-propylbromide was added to the reaction mixture and then 4.54 g (0.081 moles) of potassium hydroxide in 30 mL of methanol was added to the reaction mixture and reacted 6 hrs. at 60° C. After cooling to room temperature the reaction mixture was transferred to a separatory funnel, 1.5 Liters of toluene was added and then washed four times with 1 Liter of water, dried over magnesium sulfate, filtered and stripped under vacuum, yielding 334.73 g of resin; $M_n=730$, $M_w=1800$, dispersity of 2.5; IR indicates presence of no residual hydroxyl moieties.

EXAMPLE 4

Synthesis of Styrene Terminated Bisphenol-A-Formaldehyde-Dihydroxybenzophenone (STBPA-F-BP (70 VBz/30 Pr))

Bisphenol-A-formaldehyde-dihydroxybenzophenone (BPA-F-BP) was prepared as follows: 433.75 g (1.90 moles) of bisphenol-A, 21.42 g (0.10 moles) of 4,4'-dihydroxybenzophenone, 69.07 g (2.30 moles of formaldehyde functionality) of paraformaldehyde, and 500 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 4.00 mL of concentrated sulfuric acid was added dropwise over a 3 minute interval. The reaction was maintained at 80° C. for 1 day. The solvent was distilled from the reaction mixture with the reactor equipped with a Dean-Stark trap and then the resin was poured into an aluminum pan, yielding 415.5 g of resin, $M_n=300$, $M_w=2300$, dispersity of 7.9.

228.29 grams of the above BPA-F-BP was dissolved in 700 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 213.67 g (1.400 moles) of vinylbenzylchloride (60/40 para/meta isomer ratio). The reaction mixture was heated to 60° C. and 98.19 g (1.750 moles) of potassium hydroxide in 375 mL of methanol was added dropwise over a 2.0 hr interval. The reaction was maintained at 60° C. for 19 hrs with stirring under a nitrogen purge. 99.63 g (0.810 moles) of n-propylbromide was added to the reaction mixture, to this reaction mixture was then added 45.45 g (0.810 moles) of potassium hydroxide in 250 mL of methanol over a 2 hr. interval, the reaction was maintained at 60° C. for 18 hrs. A small aliquot was removed from the reaction mixture, worked-up and IR analysis indicates residual hydroxyl moieties. 9.96 g (0.081 moles) of n-propylbromide was added to the reaction mixture, and then 4.54 g (0.081 moles) of potassium hydroxide in 20 mL of methanol was added and the reaction mixture was reacted for 18 hrs. After cooling to room temperature the reaction mixture was transferred to a separatory funnel, 1.5 Liters of toluene was added and then washed thrice with 1 Liter of water, dried over magnesium sulfate, filtered and stripped under vacuum, yielding 22.8 g of resin; Mn=700, Mw=2400, dispersity of 3.4; IR indicates presence of no residual hydroxyl moieties.

EXAMPLE 5

A series of styrene terminated bisphenol-A formaldehyde (STBPA-F) resins, Samples A, B, C, and D of Example 1, 2, 3, and 4 respectively, were cured via the following cure cycle 2 hrs. at 80° C. 16 hrs. at 100° C. 4 hrs. at 120° C., 16 hrs. at 160° C., 2 hrs. at 200° C. and 1 hr at 225° C. and their properties measured. The results are summarized in the following table.

TABLE 1

| Sample No. | STBPA-F Properties | | | |
|---|---|---|---|---|
| | A | B | C | D |
| Tg (°C.)[a] | 206 | >300 | >300 | >300 |
| Tsp (°C.)[b] | 193 ± 6 | 118 ± 5 | 205 ± 3 | 153 ± 3 |
| $\alpha_{sp}$ (ppm/°C.)[c] | 55 ± 1 | 52 ± 4 | 49 ± 3 | 80 ± 8 |
| $\alpha_{260}$ (ppm/°C.)[d] | 77 ± 1 | 66 ± 4 | 75 ± 4 | 125 ± 6 |
| $\epsilon'$[e] | 3.29 | 2.86 | 2.86 | 2.91 |
| tan $\delta$[f] | 0.004 | 0.001 | 0.006 | 0.006 |
| $\epsilon'$[g] | ND | 2.90 | 2.91 | 2.94 |
| tan $\delta$[h] | ND | 0.0005 | 0.006 | 0.017 |
| % Water Absorption[i] | ND | 0.154 | 0.300 | 0.264 |

ND: Not Determined
[a]Glass transition temperature by differential scanning calorimeter.
[b]Softening point by Thermo Mechanical Analysis - minor thermal transition.
[c]Coefficient of thermal expansion between 25° C. and softening point.
[d]Coefficient of thermal expansion between 25° C. and 260° C.
[e]Dielectric constant at 1 MHz and 0% Relative Humidity at 25° C.
[f]Loss tangent at 1 MHz and 0% Relative Humidity at 25° C.
[g]Dielectric constant at 1 MHz and 50% Relative Humidity at 25° C.
[h]Loss tangent at 1 MHz and 50% Relative Humidity at 25° C.
[i]At 50% Relative Humidity, 25° C. for 168 hours.

EXAMPLE 6

Samples A through D were prepared from Solution 1:0.4936 g of STBPA-F of Example 1 was dissolved in 4.4493 g of DMF. Samples E through H were prepared from Solution 2:0.5049 g of STBPA-F of Example 1 and 0.0063 g of 4,4'-bis(dimethylamino)benzophenone was dissolved in 4.6008 g of DMF. Sample I through L were prepared from Solution 3:0.475 g of STBPA-F of Example 1 and 0.0250 g of 4,4'-bis(dismethylamino)benzophenone was dissolved in 5.3100 g of DMF.

These solutions were spin coated onto silicon wafers at 1150 rpm for 10 seconds. The wafers were exposed to 200 Watt Mercury Vapor Lamp for varying time intervals and then checked for solubility in DMF.

TABLE 2

| Sample | UV Exposure Time (sec) | Solubility Testing Results |
|---|---|---|
| A | 30 | Dissolves readily; slight resistance to dissolution. |
| B | 60 | Resistant to dissolution; dissolves with long exposure (>0.5 Hrs) to solvent. |
| C | 120 | Resistant to dissolution; dissolves with long exposure (>0.5 Hrs.) to solvent. |
| D | 300 | Very resistant to dissolution. |
| E | 30 | Some resistance to dissolution; dissolves with long exposure (>0.5 Hrs.) to solvent. |
| F | 60 | Resistant to dissolution; dissolves with long exposure (>0.5 Hrs.) to solvent. |
| G | 120 | Resistant to dissolution; dissolves with long exposure (>0.5 Hrs.) to solvent. |
| H | 300 | Very resistant to dissolution. |
| I | 30 | Resistant to dissolution; dissolves with long exposure (>1.0 Hr.) to solvent. |
| J | 60 | Resistant to dissolution: dissolves with long exposure (>1.0 Hrs.) to solvent. |
| K | 120 | Very resistant to dissolution. |
| L | 300 | Very resistant to dissolution. |

EXAMPLE 7

A 40.60 wt. % STBPA-F (Example 2) solution in toluene was spin coated onto a silicon surface at 1000 rpm for 60 seconds. The coated discs were soft baked at 25° C. for 18 hours under vacuum. Then, they were exposed for 3 minutes to UV irradiation with a 200 watt mercury vapor lamp with a quartz/water filter. The irradiated coatings and uncured coatings were then exposed to various solvents and the amount of resin dissolved was measured. The results are shown in the following tables.

TABLE 3

| Dissolution Study of STBPA-F[a] | | | | | | |
|---|---|---|---|---|---|---|
| | % STBPA-F Removed | | | | | |
| Time (sec) | Solvent (Toluene:Ethanol)[b] | | | | | |
| | 100:0 | 80:20 | 60:40 | 40:60 | 20:80 | 0:100 |
| 0 | 0 | 0 | 0 | 0 | 0 | 0 |
| 30 | 95.88 | 96.93 | 54.71 | 25.95 | 6.51 | −1.20 |
| 60 | 98.82 | 99.39 | 61.18 | 31.01 | 8.28 | −2.41 |
| 120 | 98.24 | 99.39 | 65.29 | 36.08 | 11.24 | −3.01 |
| 180 | 97.65 | 100.00 | 66.47 | 38.61 | 13.02 | −1.81 |
| 300 | 98.24 | 100.00 | 68.82 | 42.41 | 15.98 | −1.20 |

[a]STBPA-F coated on silicon wafer and soft baked at 25° C. for 18 Hrs.
[b]Weight % solutions.

TABLE 4

| Dissolution Study of STBPA-F[a] | | | | | | |
|---|---|---|---|---|---|---|
| | % STBPA-F Removed | | | | | |
| Time (sec) | Solvent (Toluene:n-Hexane)[b] | | | | | |
| | 100:0 | 80:20 | 60:40 | 40:60 | 20:80 | 0:100 |
| 0 | 0 | 0 | 0 | 0 | 0 | 0 |
| 30 | 95.88 | 94.27 | 90.59 | 56.82 | 14.04 | 0.00 |
| 60 | 98.82 | 98.44 | 95.88 | 64.39 | 18.13 | −1.21 |
| 120 | 98.24 | 96.88 | 95.29 | 70.45 | 22.22 | 0.00 |
| 180 | 97.65 | 97.92 | 96.47 | 74.24 | 26.32 | 0.00 |
| 300 | 98.24 | 98.44 | 97.06 | 78.03 | 30.41 | 1.21 |

[a]STBPA-F coated on silicon wafer and soft baked at 25° C. for 18 Hrs.
[b]Weight % solutions.

TABLE 5

Dissolution Study of Photocured STBPA-F[a]
% STBPA-F Removed

| Time (sec) | Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 1.74 | 4.71 | 1.16 | −0.61 | −0.60 | −0.58 |
| 60 | 1.16 | 3.53 | 1.74 | −1.22 | −1.80 | −1.73 |
| 120 | 1.74 | 4.12 | 0.58 | −1.22 | −2.40 | −2.31 |
| 180 | 1.74 | 4.71 | 0.00 | −5.49 | −1.80 | −2.31 |
| 300 | 2.91 | −3.53 | 2.91 | 1.22 | −1.80 | −1.73 |

[a]STBPA-F coated on silicon wafer and soft baked at 25° C. for 18 Hrs, 3 minute cure 200 Watt Mercury Vapor Lamp with quartz/water filter.
[b]Weight % solutions.

TABLE 6

Dissolution Study of Photocured STBPA-F[a]
% STBPA-F Removed

| Time (sec) | Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 1.74 | 0.60 | −0.61 | 0.00 | 0.00 | −0.51 |
| 60 | 1.16 | 0.60 | 0.00 | −1.17 | −1.20 | −2.02 |
| 120 | 1.74 | 0.00 | 0.61 | −1.75 | −1.80 | −2.53 |
| 180 | 1.74 | 1.19 | 0.61 | 0.60 | −0.60 | −3.03 |
| 300 | 2.91 | 1.79 | 1.83 | 1.75 | −1.20 | −3.03 |

[a]STBPA-F coated on silicon wafer and soft baked at 25° C. for 18 Hrs, 3 minute cure 200 Watt Mercury Vapor Lamp with quartz/water filter.
[b]Weight % solutions.

TABLE 7

Dissolution Study of STBPA-F[a]
% STBPA-F Removed

| Time (sec) | Solvent Cyclohexane:Hexane[b] | | | |
|---|---|---|---|---|
| | 100:0 | 80:20 | 60:40 | 0:100 |
| 0 | 0 | 0 | 0 | 0 |
| 30 | 1.07 | −1.05 | −2.20 | 0.00 |
| 60 | 2.67 | 1.05 | 0.00 | −1.21 |
| 120 | 4.28 | 2.62 | 1.65 | 0.00 |
| 180 | 6.42 | 4.19 | 3.30 | 0.00 |

TABLE 7-continued

Dissolution Study of STBPA-F[a]
% STBPA-F Removed

| Time (sec) | Solvent Cyclohexane:Hexane[b] | | | |
|---|---|---|---|---|
| | 100:0 | 80:20 | 60:40 | 0:100 |
| 300 | 9.63 | 7.33 | 6.59 | 1.21 |

[a]STBPA-F coated on silicon wafer and soft baked at 25° C. for 18 Hrs.
[b]Weight % solutions.

TABLE 8

Dissolution Study of Photocured STBPA-F[a]
% STBPA-F Removed

| Time (sec) | Solvent (Cyclohexane:Hexane)[b] | | | |
|---|---|---|---|---|
| | 100:0 | 80:20 | 60:40 | 0:100 |
| 0 | 0 | 0 | 0 | 0 |
| 30 | −2.67 | −1.55 | −2.58 | −0.51 |
| 60 | −2.14 | −1.55 | −2.06 | −2.02 |
| 120 | −2.67 | −2.07 | −2.58 | −2.53 |
| 180 | −4.28 | −4.15 | −5.15 | −3.03 |
| 300 | −3.21 | −1.04 | −2.06 | −3.03 |

[a]STBPA-F coated on silicon wafer and soft baked at 25° C. for 18 Hrs, 3 minute cure 200 Watt Mercury Vapor Lamp with quartz/water filter.
[b]Weight % solutions.

TABLE 9

Dissolution Study of STBPA-F[a,b]

| Time (sec) | % STBPA-F Removed Solvent | | | | | |
|---|---|---|---|---|---|---|
| | Xylene | Cumene | iso-octane | Chlorobenzene | Nitromethane | Ethylacetate |
| 0 | 0 | 0 | 0 | 0 | 0 | 0 |
| 30 | 98.25 | 93.78 | −1.04 | 93.26 | 7.98 | 91.33 |
| 60 | 98.83 | 100.00 | −0.52 | 100.00 | 12.77 | 100.00 |
| 120 | 99.42 | 100.48 | 0.00 | 100.00 | 13.83 | 100.00 |
| 180 | 100.00 | 98.09 | −5.21 | 96.07 | 12.23 | 94.22 |
| 300 | 100.00 | 100.00 | 0.52 | 101.12 | 18.62 | 100.58 |

[a]STBPA-F coated on silicon wafer and soft baked at 25° C. for 18 Hrs.
[b]Ethanol rinse utilized for nitromethane and ethylacetate developing systems after each exposure to developing solvent.

TABLE 10

Dissolution Study of Photocured STBPA-F[a,b]

| Time (sec) | % STBPA-F Removed Solvent | | | | | |
|---|---|---|---|---|---|---|
| | Xylene | Cumene | iso-octane | Chlorobenzene | Nitromethane | Ethylacetate |
| 0 | 0 | 0 | 0 | 0 | 0 | 0 |
| 30 | 1.16 | −0.53 | 0.00 | −2.06 | −2.01 | 4.86 |
| 60 | 2.33 | 0.53 | −10.53 | 1.03 | −6.03 | −4.32 |
| 120 | 4.07 | 2.14 | −1.58 | 6.70 | −2.51 | 6.49 |
| 180 | 5.81 | 2.67 | −4.74 | 3.61 | −6.53 | 0.00 |
| 300 | 6.40 | 1.60 | −2.63 | 7.73 | −1.51 | 7.57 |

[a]STBPA-F coated on silicon wafer and soft baked at 25° C. for 18 Hrs, 3 minute cure 200 Watt Mercury Vapor Lamp with quartz/water filter.
[b]Ethanol rinse utilized for nitromethane and ethylacetate developing systems after each exposure to developing solvent.

TABLE 11

Dissolution Study of STBPA-F[a,b]

| Time (sec) | % STBPA-F Removed Solvent | | | | |
|---|---|---|---|---|---|
| | DMAc | NMP | DMF | 1-methoxy-2-propanol | Diglyme |
| 0 | 0 | 0 | 0 | 0 | 0 |
| 30 | 98.32 | 98.38 | 97.83 | 14.95 | 95.79 |
| 60 | 100.00 | 100.00 | 100.00 | 19.59 | 98.95 |
| 120 | 100.00 | 100.54 | 100.54 | 22.68 | 100.00 |
| 180 | 94.97 | 96.76 | 97.28 | 23.20 | 96.84 |
| 300 | 101.12 | 100.54 | 100.54 | 29.90 | 100.53 |

[a]STBPA-F coated on silicon wafer and soft baked at 25° C. for 18 Hrs.
[b]Ethanol rinse utilized after each exposure to developing solvent.

TABLE 12

Dissolution Study of Photocured STBPA-F[a,b]
% STBPA-F Removed

| Time (sec) | DMAc | NMP | DMF | 1-methoxy-2-propanol | Diglyme |
|---|---|---|---|---|---|
| 0 | 0 | 0 | 0 | 0 | 0 |
| 30 | 2.76 | 2.16 | 5.26 | −2.65 | 3.68 |
| 60 | 5.52 | 5.95 | 5.79 | −1.59 | 7.37 |
| 120 | 5.52 | 7.57 | 3.68 | −2.65 | 8.95 |
| 180 | 1.66 | 4.32 | −0.53 | −5.82 | 5.79 |
| 300 | 6.63 | 8.65 | 6.32 | −1.59 | 7.89 |

[a]STBPA-F coated on silicon wafer and soft baked at 25° C. for 18 Hrs, 3 minute cure 200 Watt Mercury Vapor Lamp with quartz/water filter.
[b]Ethanol rinse utilized after each exposure to developing solvent.

EXAMPLE 8

STBPA-F of Example 2 was dissolved in toluene to yield a solution of composition 40.60 wt. % STBPA-F and 59.40% toluene. This solution was spin coated onto a silicon surface utilizing spin coating rates from 500 to 2000 rpm for 60 seconds; soft baked for 18 hours at 25° C. under vacuum. The samples were then exposed for 60 to 180 seconds to UV irradiation with a 200 watt mercury lamp employing an USAF Test Resolution Pattern and a quartz/water filter. The photocured polymer was then developed for 45 seconds to 120 seconds at 25° C. with: a) toluene with a hexane rinse, or b) diglyme with an ethanol rinse. The air dried substrate was hard baked employing a cure cycle under vacuum of 25° C. to 230° C. ramp in 2 hours, held at 230.C for 1 hour and then cooled to room temperature over a 2 hour period.

The film thickness of the photocured polymer was analyzed employing a Taylor-Hobson Talysurf 10 profilometer.

TABLE 13

| Sample | Spin Speed (rpm) | UV Cure Time (secs.) | Developing Solvent | Developing Time (secs.) | Film Thickness (μm) |
|---|---|---|---|---|---|
| 1 | 500 | 180 | Toluene | 90 | 19.6 |
| 2 | 500 | 120 | Diglyme | 120 | 16.5 |
| 3 | 800 | 120 | Toluene | 90 | 14.0 |
| 4 | 800 | 120 | Diglyme | 60 | 14.0 |
| 5 | 800 | 120 | Diglyme | 120 | 14.7 |
| 6 | 800 | 60 | Diglyme | 90 | 12.2 |
| 7 | 1000 | 120 | Diglyme | 45 | 12.8 |
| 8 | 1000 | 120 | Diglyme | 90 | 14.4 |
| 9 | 1000 | 60 | Diglyme | 120 | 12.1 |
| 10 | 1500 | 120 | Diglyme | 45 | 9.6 |
| 11 | 1500 | 120 | Diglyme | 90 | 10.7 |
| 12 | 1500 | 60 | Diglyme | 120 | 10.0 |
| 13 | 2000 | 120 | Diglyme | 60 | 7.4 |
| 14 | 2000 | 60 | Diglyme | 60 | 8.3 |
| 15 | 2000 | 120 | Diglyme | 90 | 8.0 |

EXAMPLE 9

STBPA-F of Example 2 was dissolved in xylene to yield a solution of composition 42.16 wt. % STBPA-F and 57.84% xylene. This solution was spin coated onto a silicon surface utilizing spin coating rates from 500 to 2000 rpm for 60 seconds; soft baked for 18 hours at 25° C. under vacuum. The samples were then exposed for 120 to 180 seconds to UV irradiation with a 200 watt mercury lamp employing an USAF Test Resolution Pattern and a quartz/water filter. The photocured polymer was then developed for 45 seconds to 120 seconds at 25° C. with ethyl acetate (EtAc) or diglyme with an ethanol rinse. The air dried substrate was hard baked employing a cure cycle under vacuum of 25° C. to 230° C. ramp in 2 hours, held at 230° C. for 1 hour and then cooled to room temperature over a 2 hour period. The film thickness of the photocured polymer was analyzed employing a Taylor-Hobson Talysurf 10 profilometer.

TABLE 14

| Sample | Spin Speed (rpm) | UV Cure Time (secs.) | Developing Solvent | Developing Time (secs.) | Film Thickness (μm) |
|---|---|---|---|---|---|
| 1 | 500 | 120 | EtAc | 90 | 16.2 |
| 2 | 500 | 120 | Diglyme | 90 | 20.5 |
| 3 | 500 | 180 | EtAc | 120 | 18.2 |
| 4 | 800 | 180 | EtAc | 120 | 9.3 |
| 5 | 800 | 120 | Diglyme | 90 | 8.5 |
| 6 | 800 | 120 | EtAc | 90 | 9.7 |
| 7 | 1000 | 120 | EtAc | 90 | 8.0 |
| 8 | 1000 | 120 | Diglyme | 90 | 8.9 |
| 9 | 1000 | 120 | Diglyme | 90 | 8.4 |
| 10 | 1500 | 120 | EtAc | 90 | 7.8 |
| 11 | 1500 | 120 | EtAc | 45 | 7.8 |
| 12 | 1500 | 120 | Diglyme | 45 | 8.0 |
| 13 | 2000 | 120 | Diglyme | 45 | 8.7 |
| 14 | 2000 | 120 | Diglyme | 45 | 7.5 |
| 15 | 2000 | 120 | EtAc | 45 | 10.0 |

EXAMPLE 10

A 60.87 wt. % STBPA-F-BP (Example 4) solution in toluene was spin coated onto a silicon surface at 1000 rpm for 40 seconds. The coated discs were soft baked at 25° C. for 18 hours under vacuum. Then, they were exposed for 3 minutes to UV irradiation with a 200 watt mercury vapor lamp with a quartz/water filter. The irradiated coatings and uncured coatings were then exposed to various solvents and the amount of resin dissolved was measured. The results are shown in the following tables.

TABLE 15

Dissolution Study of STBPA-F-BP[a]
% STBPA-F-BP Removed

| Time (sec) | Toluene | Hexane | Cyclo-hexane | Xylene | Cumene | Chloro-benzene |
|---|---|---|---|---|---|---|
| 0 | 0 | 0 | 0 | 0 | 0 | 0 |
| 30 | 96.62 | 2.06 | 6.34 | 99.00 | 96.23 | 96.15 |
| 60 | 100.00 | 2.75 | 9.86 | 101.00 | 99.69 | 99.04 |
| 120 | — | 5.50 | 14.44 | — | — | — |
| 180 | — | 5.15 | 19.72 | — | — | — |
| 300 | — | 4.47 | 19.37 | — | — | — |

[a]STBPA-F-BP coated on silicon wafer and soft baked at 25° C. for 18 Hrs.

TABLE 16

Dissolution Study of Photocured STBPA-F-BP[a]
% STBPA-F-BP Removed

| Time (sec) | Toluene | Hexane | Cyclo-hexane | Xylene | Cumene | Chloro-benzene |
|---|---|---|---|---|---|---|
| 0 | 0 | 0 | 0 | 0 | 0 | 0 |
| 30 | 7.43 | 1.01 | 1.03 | 6.29 | 6.18 | 6.64 |
| 60 | 7.77 | 2.02 | 3.09 | 7.34 | 8.73 | 9.59 |
| 120 | 9.80 | 1.68 | 3.09 | 7.34 | 11.64 | 9.23 |
| 180 | 9.80 | 2.02 | 4.47 | 7.69 | 12.36 | 9.59 |
| 300 | 9.46 | 2.69 | 3.09 | 8.39 | 15.64 | 8.86 |

[a]STBPA-F-BP coated on silicon wafer and soft baked at 25° C. for 18 Hrs, 3 minute cure 200 Watt Mercury Vapor Lamp with quartz/water filter.

TABLE 17

Dissolution Study of STBPA-F-BP[a,b]
% STBPA-F-BP Removed

| Time | Solvent | | | | | |
|---|---|---|---|---|---|---|
| (sec) | NMP | DMF | Ethanol | EtAc | BuAc | DMAc |
| 0 | 0 | 0 | 0 | 0 | 0 | 0 |
| 30 | 95.86 | 98.65 | 4.53 | 97.63 | 98.95 | 100.00 |
| 60 | 100.69 | 100.34 | 7.32 | 100.00 | 98.95 | 100.72 |
| 120 | — | — | 8.01 | — | — | — |
| 180 | — | — | 9.06 | — | — | — |
| 300 | — | — | 8.36 | — | — | — |

[a]STBPA-F-BP coated on silicon wafer and soft baked at 25° C. for 18 Hrs.
[b]Ethanol rinse utilized after each exposure to developing solvent.

TABLE 18

Dissolution Study of Photocured STBPA-F-BP[a,b]
% STBPA-F-BP Removed

| Time | Solvent | | | | | |
|---|---|---|---|---|---|---|
| (sec) | NMP | DMF | Ethanol | EtAc | BuAc | DMAc |
| 0 | 0 | 0 | 0 | 0 | 0 | 0 |
| 30 | 15.32 | 16.61 | 2.10 | 13.71 | 4.75 | 6.78 |
| 60 | 13.25 | 17.29 | 2.80 | 19.40 | 8.14 | 7.12 |
| 120 | 12.91 | 16.27 | 2.10 | 22.07 | 13.56 | 7.46 |
| 180 | 11.92 | 17.29 | 1.40 | 22.74 | 16.61 | 7.46 |
| 300 | 14.24 | 15.93 | 2.10 | 23.41 | 20.00 | 6.44 |

[a]STBPA-F-BP coated on silicon wafer and soft baked at 25° C. for 18 Hrs, 3 minute cure 200 Watt Mercury Vapor Lamp with quartz/water filter.
[b]Ethanol rinse utilized after each exposure to developing solvent.

TABLE 19

Dissolution Study of STBPA-F-BP[a,b]
% STBPA-F-BP Removed

| Time | Solvent | | |
|---|---|---|---|
| (sec) | Diglyme | 1-methoxy-2-propanol | Nitromethane |
| 0 | 0 | 0 | 0 |
| 30 | 97.93 | 81.91 | 21.05 |
| 60 | 99.66 | 90.78 | 25.96 |
| 120 | 100.00 | 93.52 | 29.12 |
| 180 | — | 93.52 | 30.88 |
| 300 | — | 93.86 | 31.93 |

[a]STBPA-F-BP coated on silicon wafer and soft baked at 25° C. for 18 Hrs.
[b]Ethanol rinse utilized after each exposure to developing solvent.

TABLE 20

Dissolution Study of Photocured STBPA-F-BP[a,b]
% STBPA-F-BP Removed

| Time | Solvent | | |
|---|---|---|---|
| (sec) | Diglyme | 1-methoxy-2-propanol | Nitromethane |
| 30 | 13.98 | 6.64 | 8.25 |
| 60 | 13.26 | 6.99 | 3.30 |
| 120 | 12.90 | 8.39 | 2.97 |
| 180 | 12.19 | 8.39 | 2.31 |
| 300 | 12.19 | 8.04 | 2.31 |

[a]STBPA-F-BP coated on silicon wafer and soft baked at 25° C. for 18 Hrs, 3 minute cure 200 Watt Mercury Vapor Lamp with quartz/water filter.
[b]Ethanol rinse utilized after each exposure to developing solvent.

EXAMPLE 11

STBPA-F-BP of Example 4 was dissolved in toluene to yield a solution of composition 46.17 wt. % STBPA-F-BP and 53.83 % toluene. This solution was spin coated onto a silicon surface utilizing spin coating rates from 500 to 2000 rpm for 40 seconds; soft baked for 18 hours at 25° C. under vacuum. The samples were then exposed for 30 to 90 seconds to UV irradiation with a 200 watt mercury lamp employing an USAF Test Resolution Pattern and a quartz/water filter. The photocured polymer was then developed for 15 seconds at 25° C. with butyl acetate (BuAc) or diglyme with an ethanol rinse. The air dried substrate was hard baked employing a cure cycle under vacuum of 25° C. to 230° C. ramp in 2 hours, held at 230° C. for 1 hour and then cooled to room temperature over a 2 hour period.

The film thickness of the photocured polymer was analyzed employing a Taylor-Hobson Talysurf 10 profilometer.

TABLE 21

| Sample | Spin Speed (rpm) | UV Cure Time (secs.) | Developing Solvent | Developing Time (secs.) | Film Thickness (μm) |
|---|---|---|---|---|---|
| 1 | 500 | 90 | BuAc | 15 | 9.6 |
| 2 | 500 | 30 | BuAc | 15 | 8.2 |
| 3 | 500 | 90 | Diglyme | 15 | 8.2 |
| 4 | 800 | 90 | Diglyme | 15 | 7.6 |
| 5 | 800 | 30 | Diglyme | 15 | 7.2 |
| 6 | 800 | 90 | BuAc | 15 | 7.2 |
| 7 | 1000 | 90 | BuAc | 15 | 6.3 |
| 8 | 1000 | 45 | BuAc | 15 | 6.3 |
| 9 | 1000 | 90 | Diglyme | 15 | 6.4 |
| 10 | 1500 | 90 | Diglyme | 15 | 5.8 |
| 11 | 1500 | 90 | BuAc | 15 | 5.9 |
| 12 | 1500 | 30 | BuAc | 15 | 5.3 |
| 13 | 2000 | 90 | BuAc | 15 | 4.8 |
| 14 | 2000 | 30 | BuAc | 15 | 4.6 |
| 15 | 2000 | 90 | Diglyme | 15 | 4.8 |

I claim:

1. An electronic interconnect structure comprising electrical and dielectric levels wherein a cured polymer is the dielectric level, said polymer being produced by the method comprising:

(a) coating a substrate with a prepolymer which is an ether of the oligomeric condensation product of a dihydric phenol and formaldehyde having the formula

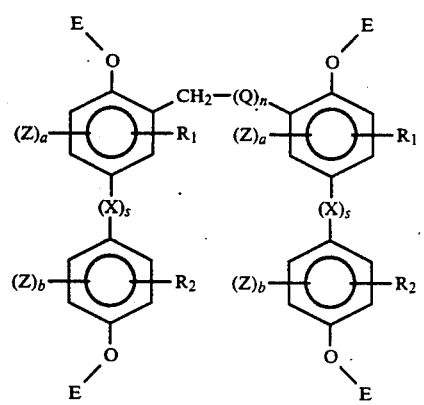

where the recurring unit Q has the structure,

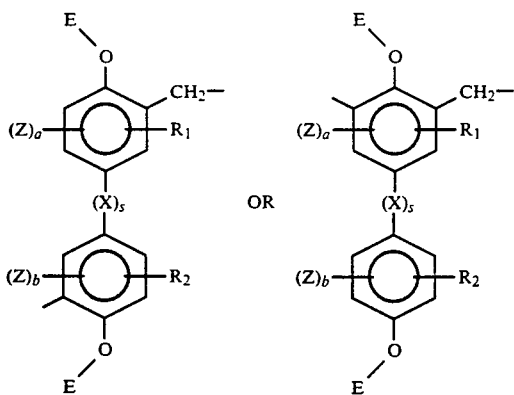

and n is an integer from 1 to 10;
s is 0 or 1;
each X is independently selected from the group consisting of $CH_2$, $C(CH_3)_2$, O, S, $SO_2$, CO, and $OC_6H_4O$;
each $R_1$ and $R_2$ is independently selected from the group consisting of hydrogen, alkyl and alkoxy moieties containing 1 to 10 carbon atoms, phenyl and phenoxy;
a and b are independently 0 or integers from 1 to 4;
Z is Cl or Br;
E is selected from the group consisting of the vinylbenzyl moiety, alkyl moieties containing 1 to 10 carbon atoms, or benzyl, subject to the constraint that at least 50% of all E's are the vinylbenzyl moiety;

(b) irradiating the coated prepolymer of (a) through a masking pattern to selectively crosslink the portion of said coating being irradiated;

(c) selectively dissolving the non-irradiated part of the prepolymer coating of (a); and (d) curing the crosslinked portion of the prepolymer coating by heating at a temperature in the range of 100° C. to 300° C. for a time sufficient to further crosslink said crosslinked coating and to transform the prepolymer to an infusible glassy solid.

2. An electronic interconnect structure of claim 1 wherein said cured polymer is adhered to a layer of chromium metal.

* * * * *